(12) United States Patent
Vu et al.

(10) Patent No.: US 6,270,580 B2
(45) Date of Patent: *Aug. 7, 2001

(54) MODIFIED MATERIAL DEPOSITION SEQUENCE FOR REDUCED DETECT DENSITIES IN SEMICONDUCTOR MANUFACTURING

(75) Inventors: Lan Vu, Austin; Dennis C. Swartz, Buda; Jeff Watts, Georgetown, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/291,138

(22) Filed: Apr. 12, 1999

(51) Int. Cl.[7] .................................................... C23C 16/00
(52) U.S. Cl. ............................................. 118/666; 118/725
(58) Field of Search .................................. 118/725, 666; 150/345; 204/298.09, 298.05

(56) References Cited

U.S. PATENT DOCUMENTS

| | | | | |
|---|---|---|---|---|
| H1145 | * | 3/1993 | Anderson | 118/725 |
| 4,401,054 | * | 8/1983 | Matsuo | 118/723 MR |
| 5,730,803 | * | 3/1998 | Steger | 118/725 |
| 5,888,414 | * | 3/1999 | Collins | 156/345 |
| 5,948,283 | * | 9/1999 | Grosshart | 118/725 |
| 5,948,704 | * | 9/1999 | Benjamin | 118/725 |
| 5,958,510 | * | 9/1999 | Sivaramakrishnan | 118/725 |

OTHER PUBLICATIONS

Pierson, Handbook of CVD, Noyes Publications, Park Ridge, N.J., pp. 98–100, 1992.*

* cited by examiner

Primary Examiner—Richard Bueker
(74) Attorney, Agent, or Firm—Kevin L. Daffer; Conley, Rose & Tayon P.C.

(57) ABSTRACT

A method and apparatus for forming high-quality deposited material layers in semiconductor manufacturing are provided. In the method, the initial stages of a deposition are performed with no current flowing through substrate heater filaments. Current is restored to the heater filaments when needed to maintain the substrate within an acceptable range around a target or setpoint temperature. When an on/off temperature controller is used, the method may be implemented without disturbing the normal operation of the controller, by monitoring the heater filament current and beginning a deposition just after the current has been turned off by the controller. Current may also be removed from the heater filaments at the end of the deposition, so that concentrations of deposition species may equilibrate without the presence of heater currents. Performing as much of the deposition as possible with the substrate heater current off is believed to reduce defect formation which may be associated with magnetic fields and outgassing resulting from heater filament operation. A substrate heater design is provided in which heater filaments are eliminated and the substrate is heated using a heated, circulating fluid.

10 Claims, 8 Drawing Sheets

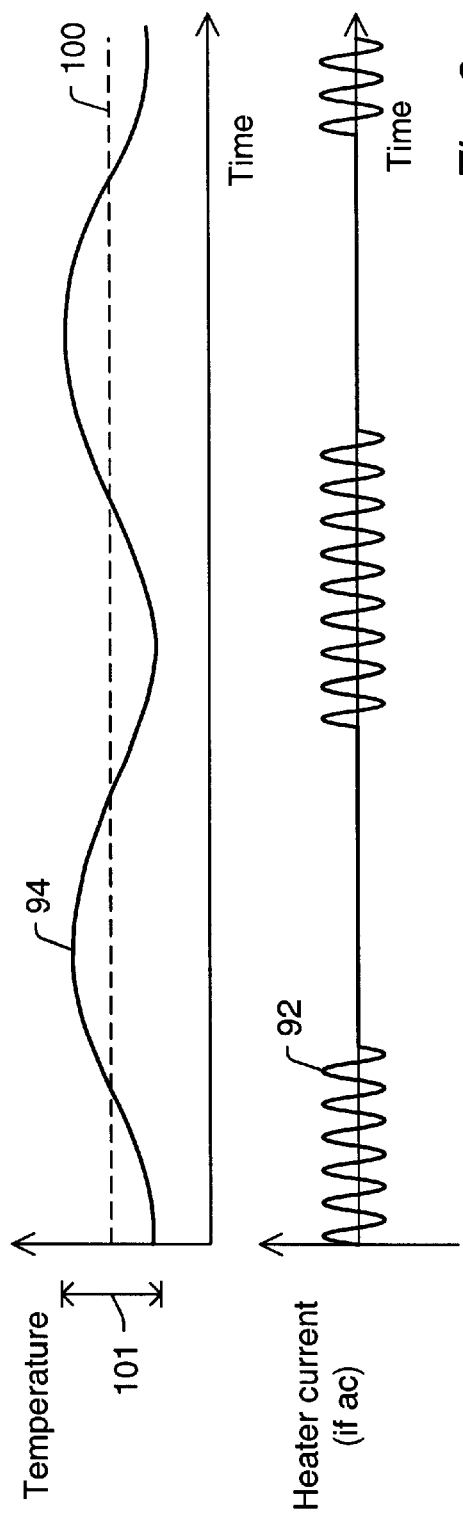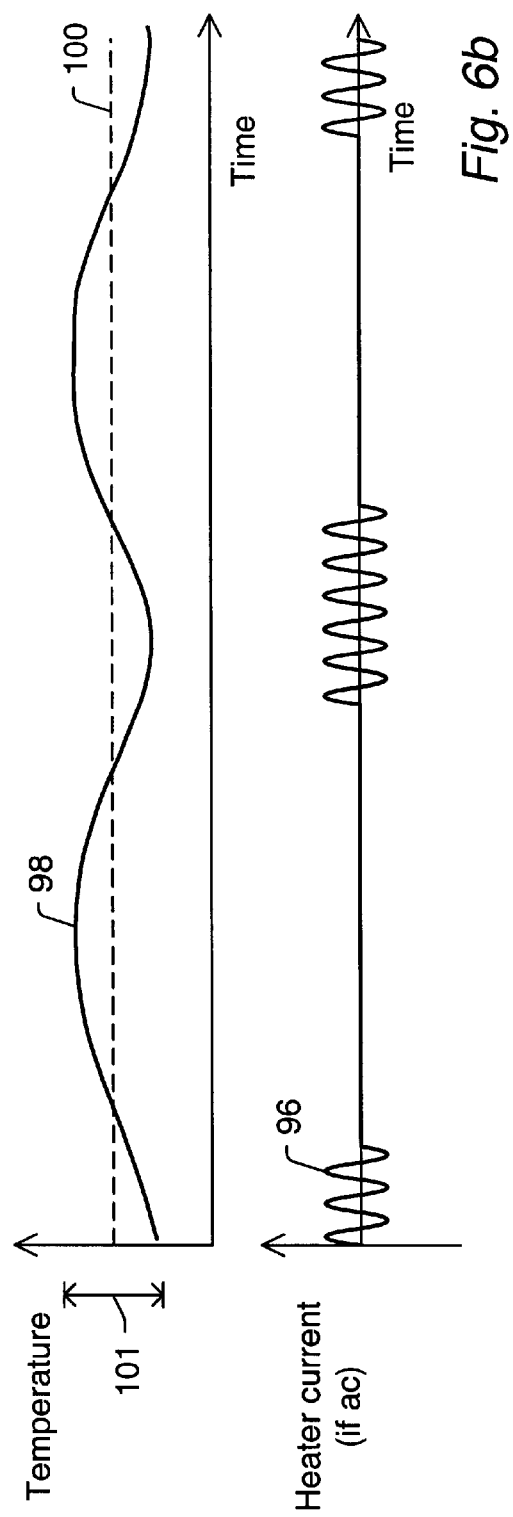

MODIFIED MATERIAL DEPOSITION SEQUENCE FOR REDUCED DETECT DENSITIES IN SEMICONDUCTOR MANUFACTURING

BACKGROUND OF THE INVENTION

1. Field of the Invention

This invention relates to integrated circuit fabrication and, more particularly, to a method for reducing defects associated with deposition processes.

2. Description of the Relevant Art

Fabrication of a metal-oxide-semiconductor (MOS) integrated circuit (IC) involves numerous processing steps. A gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. Such transistors are connected to each other and to terminals of the completed integrated circuit using conductive interconnect lines. Typically, multiple levels of interconnect are needed to provide the connections necessary for a modem, high-transistor-density IC.

Many of the processing steps mentioned above involve deposition of a material layer onto a semiconductor topography (semiconductor substrate with overlying layers and structures). For example, a gate conductor is typically patterned from a polysilicon layer deposited using chemical vapor deposition (CVD). Interlevel dielectrics, which insulate layers of interconnect from each other and from underlying devices, are also generally deposited using CVD. Interconnect formation often involves deposition of metal films by either CVD or by physical vapor deposition (PVD) methods, such as evaporation or sputtering. As is partially illustrated by these examples, effective deposition processes are critical to the success of integrated circuit fabrication.

A pervasive trend in modern integrated circuit manufacture is to produce transistors having feature sizes as small as possible. Many modem processes employ features, such as gate conductors and interconnects, which have less than 1.0 $\mu$m critical dimension. As feature size decreases, the sizes of the resulting transistors as well as those of the interconnects between transistors also decrease. Fabrication of smaller transistors allows more transistors to be placed on a single monolithic substrate, thereby allowing relatively large circuit systems to be incorporated on a single, relatively small die area.

This trend toward reduced feature sizes imposes severe demands on many aspects of IC fabrication, including deposition processes. For example, reduction of device and interconnect dimensions may result in increased electric fields within the circuit (unless operating voltages are decreased by a corresponding amount). Increased electric fields require increased uniformity of layer thickness, composition, and structural quality in order to prevent local breakdown of or capacitive coupling through a deposited layer. Furthermore, decreased dimensions increase the probability that a localized defect such as a pinhole or a defect associated with a particle will be significantly detrimental to circuit operation. As an example, a particle landing on the surface of a semiconductor topography near the beginning of a metal deposition process may result in a lack of metal adhesion in the immediate vicinity of the particle. If the particle is included within a metal interconnect, a substantial portion of the width of the interconnect at the location of the particle could be rendered nonconductive. This effective narrowing of the interconnect at the location of the particle may increase the interconnect resistance at that location, and thereby result in excess heating as current flows through the high-resistance portion. Such heating may ultimately cause interconnect failure and render a circuit inoperative.

The importance of high-quality, high-uniformity deposited layers to continued improvement in IC performance has motivated substantial effort by IC manufacturers, process equipment manufacturers, and university researchers toward improving deposition process reliability. Extensive experimentation and computer modeling have been employed in identifying sources of defects and nonuniformity in deposited layers. Deposition reactor designs and deposition conditions and sequences have been optimized with the goal of eliminating these sources of defects and nonuniformity.

Despite the above-described efforts, some defects are present in typical deposited films. Moreover, some of the observed defects do not appear to be associated with controllable variables, and are therefore believed to be associated with inconsistencies in deposition equipment operation. It would therefore be desirable to develop a method for reducing densities of defects associated with process equipment inconsistencies. Such a method could also improve wafer-to-wafer consistency of deposited layers.

SUMMARY OF THE INVENTION

The problems outlined above are in large part addressed by a material deposition method in which currents flowing through substrate heater filaments are eliminated to the extent possible during the deposition. Elimination of substrate-heater current is believed to reduce defect formation which may be associated with heater currents flowing in the vicinity of the semiconductor topography. It is postulated that magnetic fields associated with such heater currents may disturb the initial adhesion of deposited atoms to the surface of the semiconductor topography. For example, such magnetic fields may distort the spatial distribution of atoms and molecules approaching the surface. This effect of magnetic fields may be particularly relevant for deposition methods in which charged species are involved in the deposition process.

It is further postulated that substrate heater current is associated with outgassing of components in the vicinity of the heater, which may include the substrate mounting assembly, the substrate, and/or other chamber surfaces. Such outgassing typically releases impurity atoms such as carbon or oxygen into the deposition chamber ambient. These outgassed impurity atoms may react with atoms involved in the deposition process, possibly forming unintended reaction products. Such unintended reaction products may lead to defects in the deposited layer. Defects may occur, for example, through reaction product formation directly upon the deposited layer surface. Alternatively, unintended reaction products may form a layer upon a different chamber surface which may subsequently form flakes which land on the deposited layer surface. Reduction of the heater current is believed to reduce the outgassing which may cause the above-described defect formation.

Virtually all deposition processes used in semiconductor fabrication require heating of the semiconductor substrate during deposition. In a CVD process, a substrate is exposed to gases which undergo a chemical reaction to form the desired material on the substrate surface. Substrate heating is required to provide energy both for the chemical reaction to occur, and for the deposited atoms to migrate on the surface of the growing layer and form stable bonds. Low-pressure CVD of silicon dioxide using decomposition of tetraethyl orthosilicate (TEOS), for example, typically requires substrate temperatures of about 650° C. or higher. In some deposition methods, such as plasma-enhanced CVD (PECVD) and sputtering, a glow discharge is created. The glow discharge imparts energy to the atoms being deposited, so that less thermal energy from substrate heating is needed. Some substrate heating is still required, however, even for these methods. PECVD deposition of $SiO_2$ is typically performed using substrate temperatures between about 200° C. and about 450° C., while sputtering of metals may be done at temperatures between about 200° C. and about 400° C.

An example of a particular deposition process in which many of the above-described defect formation problems are believed to occur is sputtering of titanium and titanium nitride. Sputtering systems employ a glow discharge to create sputter gas ions which are accelerated into a target formed from the material to be deposited. Bombardment of the target by the sputter gas ions causes atoms from the target to be dislodged. A large fraction of the dislodged target atoms (subject to the design of the particular sputtering system) are subsequently deposited onto the substrate to form the deposited layer. Because the spacing between the target and the substrate is often quite small (less than 1 cm), and the glow discharge is located between the target and the substrate, a significant portion of the species reaching the substrate during a deposition may be charged. Such charged species may include sputter gas ions, secondary electrons emitted from the target, and target and/or impurity atoms ionized through interaction with the secondary electrons. The trajectories of these charged species may be changed by the magnetic fields associated with current flow through substrate heaters during a deposition. In addition, many sputtering systems employ magnetic fields in the vicinity of the target to help confine secondary electrons in the vicinity of the target. Such confinement increases production of sputter gas ions and thereby increases the deposition rate. Magnetic fields associated with the substrate heater may interfere with the effectiveness of these confining magnetic fields.

Sputtered titanium is often used between an interconnect metal such as aluminum and an underlying dielectric, as a diffusion barrier and/or adhesion layer. Because such films are relatively thin (generally less than about 200 nm), they can often be sputter-deposited in quite short deposition times, such as about 10 seconds or less. Deposition of these films with short deposition times is especially well-suited to the method recited herein, since in this case the substrate heater may often be left off for an entire deposition without an appreciable change in the substrate temperature. Titanium sputtering processes are known to suffer from significant unintended titanium oxide formation, resulting in a black coating on chamber surfaces, concentrated in the area of the target. This coating is susceptible to flaking, which may result in defects in the deposited film. The deposition chamber must therefore be cleaned frequently, typically by replacement of a set of chamber wall shields known as a "kit". Elimination of substrate heater current during all or part of the titanium deposition may reduce outgassing in the vicinity of the substrate, thereby reducing introduction of oxygen-containing molecules into the chamber ambient. Such a reduction in the concentration of oxygen-containing molecules may result in a reduction of titanium oxide formation on the chamber walls, and a reduction in associated defects and required chamber maintenance.

Titanium nitride is often sputter-deposited over aluminum, or other metals to be patterned, for use as an anti-reflection coating (ARC). An ARC reduces inaccuracies in photoresist exposure caused by reflection of exposing radiation from the underlying metal surface during subsequent photolithographic patterning processes. By comparison of titanium nitride sputter-deposited using two different levels of substrate heater power, it has been observed that defect densities in the deposited layer are reduced for a lower level of substrate heater power. "Level of substrate heater power" in the comparison described here refers to the fraction of time that the substrate heater power is turned on by an on/off temperature controller. The two titanium nitride layers compared were both deposited using a substrate temperature of 350° C. The difference in substrate heater power required to maintain the substrate temperature arose from a removal of cooling water flow through a heat sink associated with the substrate heater during one of the depositions. This technique of altering the thermal load of the substrate heater is discussed further below. The increased defect density of the layer deposited using a higher level of substrate heater power is believed to be related to one or more of the defect generation mechanisms discussed above, and elimination or reduction of substrate heater currents is believed to provide a way of reducing defect densities.

In one embodiment of the method recited herein, substrate heater current may be eliminated by turning the heater power off just prior to initiating layer deposition. The initial stages of deposition are believed to be particularly important to the quality of a deposited layer, and the reduced defect formation believed to result from eliminating the heater current is therefore especially important at the beginning of the deposition. The temperature of the semiconductor substrate is preferably monitored during the deposition, so that the substrate heater power may be turned back on when the substrate temperature drops below a predetermined minimum value for the deposition. For layers with very short deposition times (for example, some sputtered metal layers have deposition times of less than ten seconds), this embodiment of the method may allow the entire deposition to be completed with the substrate heater powered off. For layers with longer deposition times and/or more stringent temperature stability requirements, at least an initial portion of the deposition may be performed before the heater power is restored.

The switching on and off of heater power and monitoring of substrate temperature described above may be performed either manually or automatically using, for example, a temperature controller. Various control modes may be used by a temperature controller to control substrate temperature, including on/off control, proportional control, proportional-integral (PI) control, and proportional-integral-derivative (PID) control. For any of these modes, the heater current is changed by the controller in response to changes in a measured temperature signal, with the goal of keeping the temperature as close as possible to a preset value. In embodiments for which a temperature controller is used, switching the heater power off as part of the method recited herein may involve disabling the control of the heater by the temperature controller. Substrate heaters used in semiconductor fabrication equipment are typically connected to on/off temperature controllers, which control temperature by turning the heater power on and off as needed to maintain the substrate temperature within a predetermined range. In embodiments for which such an on-off temperature controller is used, the method may also be implemented without interfering with the normal action of the temperature controller. This may be done by monitoring the heater current, and initiating the deposition just after the heater power is turned off by the controller. The heater is subsequently turned back on by the controller, if necessary, in the course of maintaining its temperature setpoint.

Further embodiments of the method recited herein involve removing power from the heater filaments at the end of the deposition. For example, heater power may be removed at the time that deposition gases are shut off (for non-plasma-enhanced systems) or the time that plasma power is removed (for systems using a plasma). It is believed that the time needed for the deposition species concentrations to return to zero after the deposition is ended may also be a critical time for prevention of defect formation. Removing power to the heater at this time may therefore help reduce defect formation, for at least the reasons given above. The length of time following the deposition that the heater power is left off may be determined by balancing the advantages of leaving the heater power off with the need to have the substrate heater at deposition temperature for the next substrate to enter the deposition chamber. The removal of the heater power at the end of a deposition may be combined with the embodiments described above for removing the heater power at the beginning of and during the deposition.

For some substrate heater configurations, it may be possible to alter the thermal load of the substrate heater, thereby reducing the power which must be applied to the heater to maintain a given temperature. For example, some substrate heaters are placed in proximity to a fluid-cooled surface which acts as a heat sink to help carry heat away from the substrate. Such a heat sink may be used, for example, in maintaining very low substrate temperatures or in achieving more rapid cooling of the substrate. Use of such a heat sink presents an increased thermal load to the substrate heater. For example, an increased heater power must be used to maintain a given temperature when cooling fluid is flowing through the above-described heat sink than when the cooling fluid is turned off. Turning the cooling fluid to the heat sink off is therefore a way to reduce the thermal load of the substrate heater and reduce the power which is supplied to the heater to maintain a given temperature. For embodiments in which a substrate heater configuration having such a changeable thermal load is used, the method recited herein may be implemented by reducing the thermal load of the substrate heater during a deposition process. If such a reduction in thermal load is implemented for a system having a typical on/off temperature controller, the fraction of time for which the heater is turned on by the controller is reduced. Such a reduction in heater on time may facilitate the embodiment described above in which the deposition is initiated after the heater is turned off during the normal course of controller operation. The increased fraction of time that the heater is turned off may allow an extended deposition time free of heater currents.

In addition to the method described above, an improved substrate heater for deposition processes in semiconductor manufacturing is contemplated herein. The substrate heater employs a heated circulating fluid rather than electrically-powered heating elements to maintain the temperature of a substrate. The fluid may be heated using electrical elements in a heating unit external to the deposition chamber, so that no electrical heating elements and associated magnetic fields are in the vicinity of the substrate during a deposition. The defects described above which are believed to result from magnetic fields associated with substrate heater currents may therefore be reduced.

BRIEF DESCRIPTION OF THE DRAWINGS

Other objects and advantages of the invention will become apparent upon reading the following detailed description and upon reference to the accompanying drawings in which:

FIGS. 6a and 6b are graphs showing representative temperature and heater current signal waveforms during a deposition sequence using the substrate heater of FIG. 5 with the heat sink fluid flow turned (a) on and (b) off;

Figure 1:
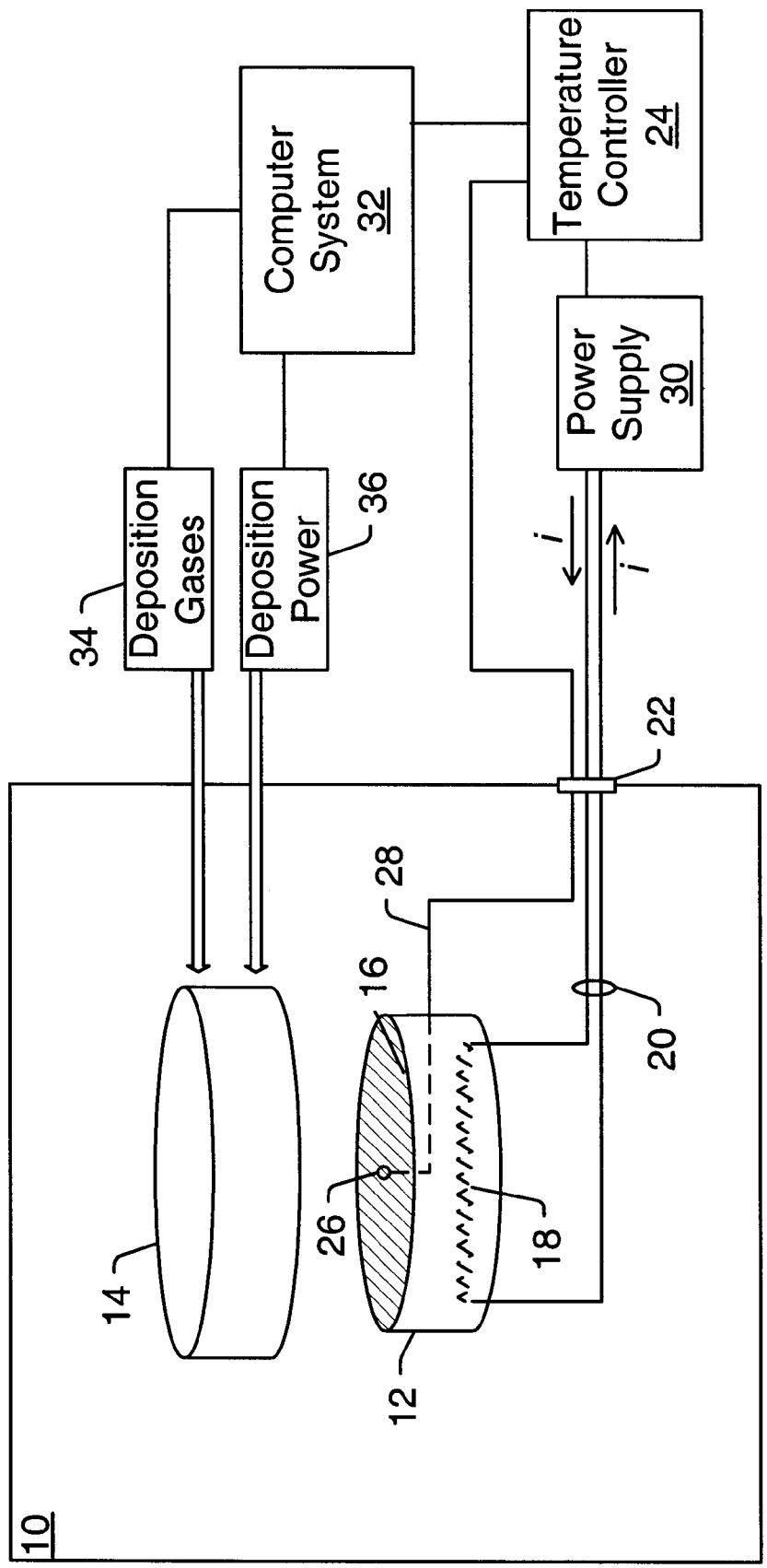
FIG. 1 is a side elevation view of an exemplary deposition system using electrical heater filaments to heat the substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Turning to the drawings, FIG. 1 is a side elevation view of an exemplary deposition system which may be used to implement some embodiments of the method recited herein. Deposition chamber 10 includes heated substrate station 12 and deposition structure 14. The nature of deposition structure 14 may depend on the specific type of deposition performed in chamber 10. For example, if chamber 10 is a sputter deposition chamber, structure 14 may include a sputtering target. Alternatively, if chamber 10 is a CVD chamber, structure 14 may comprise a "showerhead" through which reactant gases are dispersed uniformly over the substrate. A radio-frequency (RF) voltage may be applied to deposition structure 14 (or a conductive portion thereof) to create a glow discharge if chamber 10 is, for example, a PECVD chamber or a sputtering chamber.

Substrate station 12 includes substrate mounting surface 16, and one or more filaments such as heater filament 18 positioned below substrate mounting surface 16. Dashed lines are used to indicate structures in the interior of substrate station 12. Heater filament 18 may be part of a lamp assembly, in which one or more filaments are heated to incandescence. Heater lines 20 extend through the chamber wall using electrical feedthrough 22 and connect to power supply 30, which is controlled by temperature controller 24. Temperature controller 24 controls the supply of current i from supply 30 to heater filament 18, so that a substrate mounted on mounting surface 16 may be heated. Controller 24 is typically an on/off temperature controller, turning an ac current through filament 18 on and off as needed to keep the substrate temperature within an acceptable range of a temperature setpoint. Alternatively, a dc current may be supplied by power supply 30, and/or controller 24 may be a different type of controller, such as a PI or PID controller. In the embodiment of FIG. 1, substrate temperature is measured using temperature sensor 26, positioned on or near substrate mounting surface 16. Temperature sensor 26 is typically a thermocouple. Other temperature measurement techniques may also be used, however, such as optical pyrometry or infrared absorption techniques. In the embodiment of FIG. 1, a signal corresponding to the substrate temperature is provided to temperature controller 24 using temperature lead 28, which may comprise one or more wires. Controller 24 compares the measured temperature (hereinafter also called "actual temperature") with a temperature setpoint to determine whether the actual temperature is within an acceptable range of the setpoint temperature.

In the embodiment of FIG. 1, temperature controller 24 may in turn be controlled by computer system 32. Computer system 32 may provide configuration settings, such as setpoint and acceptable temperature range information, to controller 24, and, depending on the type of controller used, may also provide settings which determine, for example, the rate at which the controller responds to temperature changes. In addition to temperature controller 24, computer system 32 may control other aspects of a deposition, including the flow of deposition gases 34 and the application of deposition power 36. Deposition gases 34 may be, for example, reactant gases in the case of a CVD deposition, or a sputtering gas, such as argon or another inert gas, in the case of a sputter deposition. Deposition power 36 may be, for example, an RF voltage in the case of a PECVD deposition, or an RF or DC voltage in the case of a sputter deposition. Computer system 32 may control a deposition by running a "recipe" program entered by an operator. Such a recipe program may include, for example, the temperatures, flow rates, power levels, and deposition times needed to execute a particular deposition.

It should be noted that the deposition system used may take a different form than that shown in FIG. 1. For example, the deposition could be performed manually, by manual control of any or all of the needed equipment, such as the heater power supply, gas flowmeters, and deposition power supplies. In such a case, computer system 32 and/or temperature controller 24 of FIG. 1 may not be necessary. Manual operation is not generally used in semiconductor fabrication processes, however, in part because of difficulty in achieving highly reproducible results manually. As another example, the function of temperature controller 24 may be performed by computer system 32, using appropriate software and/or hardware interfaces. Some components of a typical deposition system, such as a vacuum pump, are not shown in FIG. 1 but should be understood to be included in deposition systems used to implement the method recited herein. The method is believed to be applicable to any deposition system which makes use of one or more electrically-heated filaments for substrate heating.

Figure 2:
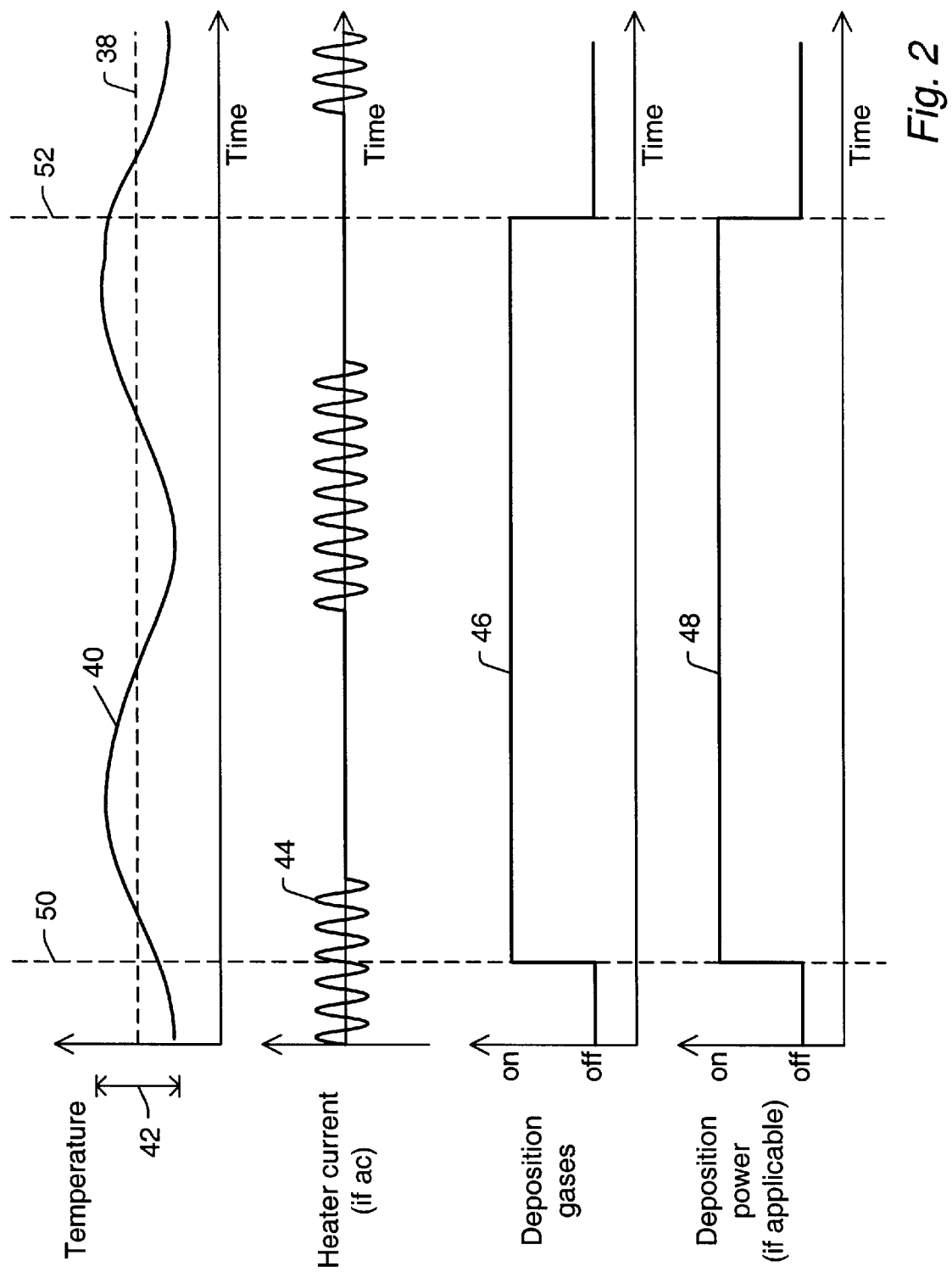
FIG. 2 is a graph showing representative temperature, heater current, gas flow, and deposition power signal waveforms during a typical deposition sequence.

A set of signals which may be associated with a representative deposition performed using an on/off ac controller in a system with substrate heater filaments is shown in FIG. 2. The uppermost signal plotted is substrate temperature versus time. Horizontal dashed line 38 represents the target or setpoint temperature for the deposition, which is held constant in the embodiment of FIG. 2. Solid line 40 represents the actual or measured deposition temperature. Range 42 is the acceptable temperature range, or twice the deviation from the setpoint temperature which can be tolerated during the deposition. The size of range 42 depends upon the capabilities of the controller/heater combination and the sensitivity of the process to temperature. Typically, the acceptable range may be between about ±1° C. and about ±10° C. Signal 44 is a heater current signal which may be provided to substrate heater filaments by an ac power supply controlled by an on/off temperature controller. When the heater current is turned "on" by the controller, a sinusoidal heater current results. The heater current goes to zero when the controller turns the power supply current "off". It can be seen by comparison of signals 40 and 44 that in the process of FIG. 2, the heater current is turned on at times when the actual temperature is approaching the bottom of acceptable range 42. The heater current is turned off again when the actual temperature is approaching the top of the acceptable range. Depending on the particular construction of the heater and sample mounting station, there may be a time delay associated with the response of the actual temperature to changes in the heater current. In some cases, as shown in FIG. 2, the temperature may temporarily continue to rise after the heater current is turned off.

Signals 46 and 48, corresponding to the states (on or off) of the deposition gas flow and the deposition power (if applicable), are shown below the heater current signal. If the deposition is done using, for example, a CVD method such as low-pressure CVD (LPCVD) or atmospheric-pressure CVD (APCVD), deposition power is not used, since no plasma is formed. In such a case, the beginning and end of the deposition are determined by the beginning and end of the flow of reactant gases. In the deposition of FIG. 2, the time that the gas flow and deposition power are turned on corresponds to the start of the deposition, indicated by vertical dashed line 50. The time that the gas flow and deposition power are turned off corresponds to the end of the deposition, indicated by vertical dashed line 52. In the case of depositions for which deposition power is applied, such as PECVD or a sputter deposition, the application of deposition power alone may be used to control the start and end of the deposition, because the flow of deposition gases alone is not sufficient to cause deposition to occur. In other words, in such depositions the deposition gases may be flowing before the deposition power is turned on and/or after the power is turned off, without changing the length of the deposition.

In the deposition corresponding to the signals of FIG. 2, the heater current is on at the beginning of the deposition. As noted above, current flow through heater filaments near a substrate is believed to be detrimental to the quality of the deposited layer, particularly when the current is flowing during the initial stages of the deposition. In a typical deposition such as that of FIG. 2, no consideration is given to whether the heater current is on or off when a deposition is started. Depending on the action of the controller, the heater may be either on or off at the beginning of the deposition.

Figure 3:
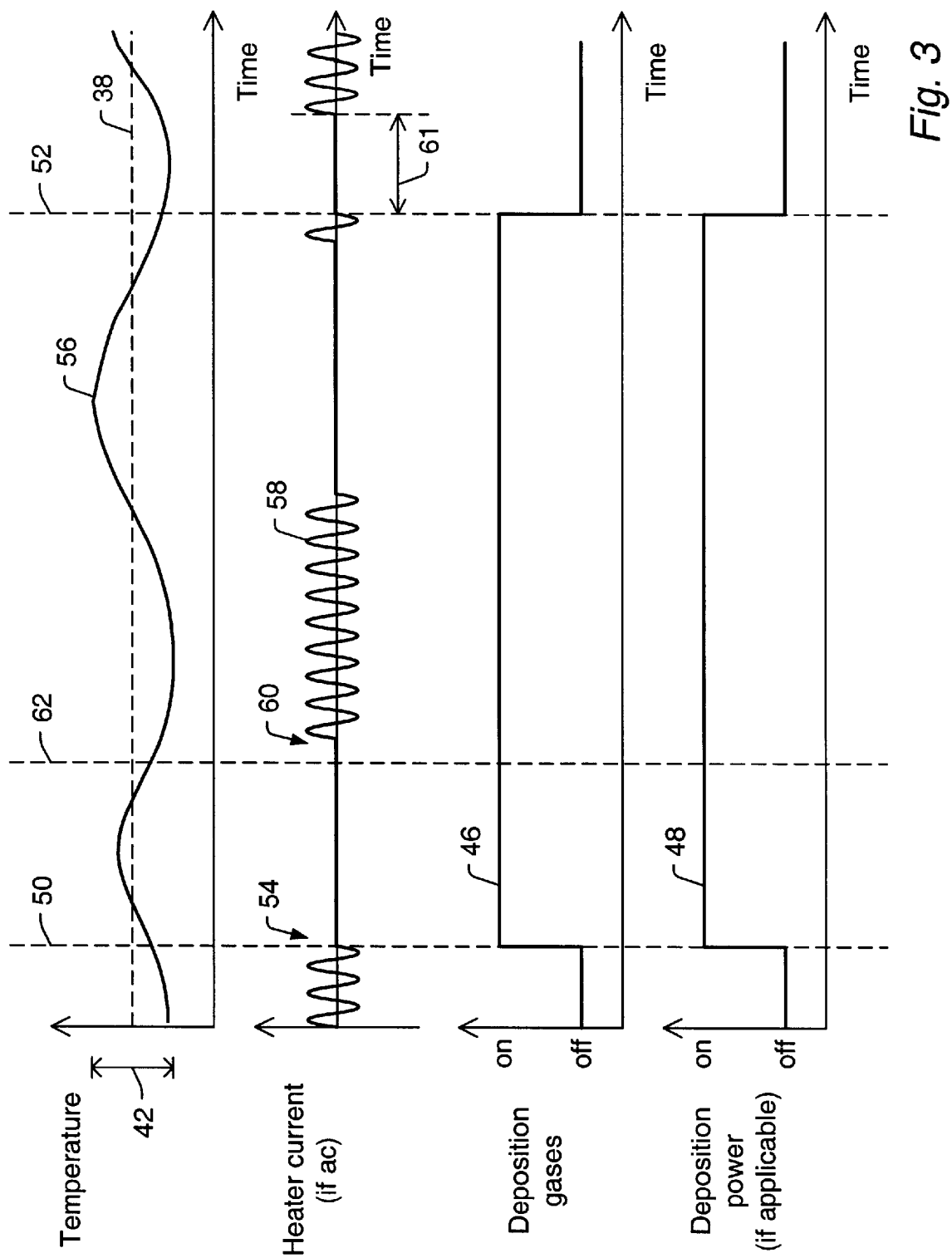
FIG. 3 is a graph showing representative temperature, heater current, gas flow, and deposition power signal waveforms during a deposition sequence corresponding to an embodiment of the method recited herein.

The heater current may be removed during at least the initial stage of a deposition using the embodiment of the method recited herein corresponding to the signals shown in FIG. 3. The depositions corresponding to the signals of FIG. 2 and FIG. 3 are similar in several respects, such as setpoint temperature 38, acceptable temperature range 42, deposition gas signal 46, deposition power signal 48, deposition start 50 and deposition end 52. The two depositions differ in that for the deposition of FIG. 3, the heater power is cut off (indicated using arrow 54) at deposition start time 50, so that heater current signal 58 goes to zero. In this way, at least an initial portion of the deposition may be performed with no current flowing through the heater filaments. In the embodiment of FIG. 3, an ac heater power supply is used, as also shown in FIG. 2, but a dc supply could be used as well. This heater power removal may be done, for example, by instructing a temperature controller to remove power to the heater, or by disabling a temperature controller's control of the heater. In the embodiment of FIG. 3, the heater power is turned off at a time when the actual temperature, indicated by solid line 56, is near the low end of acceptable range 42. Actual temperature 56 begins to fall soon after heater power cutoff 54, and approaches the bottom of acceptable temperature range 42, at which time the heater power must be turned on again to keep actual temperature 56 within range 42. This restoration of heater power, indicated by arrow 60 in FIG. 3, may be done, for example, by sending a signal to a temperature controller, or by restoring control of the heater to the temperature controller. The times with respect to the actual temperature value at which the controller turns the heater on and off in order to maintain a setpoint temperature may be different than those shown in FIGS. 2 and 3, depending on the particular controller/heater combination used.

In addition to heater power cutoff 54 at the beginning of the deposition of FIG. 3, the heater power is cut off at the end of the deposition, at time 52. The heater power is kept off to allow the concentration of deposition species to go to zero. The time for which the heater power is kept off may therefore be called reactant removal time 61. Reactant removal time 61 is chosen depending on the details of the particular process involved. For example, deposition processes run at higher chamber pressures may require more time for reactant removal after a deposition is ended. Keeping the heater off for an extended time to make sure that all reactant species are removed may conflict with a need to have the substrate heater at deposition temperature so that the next deposition process may be started without undue delay. Suitable reactant removal times for many depositions are believed to be in the range from about 1 second to about 5 seconds.

Comparing heater current signals 44 of FIG. 2 and 58 of FIG. 3, it can be seen that the "heater off" time between events 54 and 60 of FIG. 3 is significantly shorter than the "heater off" time during the deposition of FIG. 2. The time between on states of the heater is shortened for the deposition of FIG. 3 because heater current cutoff 54 happened to occur at a time when actual temperature 58 was near the bottom of acceptable range 42. In the embodiment of FIG. 3, no consideration is given to the trend of actual temperature 58 when choosing a time to begin the deposition and cut off the heater current, so that the length of time for which the heater may be left off during the deposition may vary significantly. Only for shorter depositions, such as those ending at the time indicated by vertical dashed line 62, is the heater current off for the entire deposition.

In a variation of the method illustrated by FIG. 3, a fixed time may be used between heater current cutoff 54 and heater current restoration 60, rather than monitoring the actual substrate temperature and performing current restoration 60 when the temperature approaches the bottom of acceptable range 42. The fixed time that the heater current remains off after cutoff 54 is preferably short enough that the actual temperature does not drop out of the acceptable range. Depending on the thermal behavior of the substrate holder in a particular deposition chamber and process, suitable fixed times may include a range from about 1 second to about 5 seconds. For example, one embodiment of the method recited herein includes a heater current cutoff starting at the beginning of the deposition and lasting for 2 seconds. The heater current is then restored after this 2-second cutoff, either manually or by enabling a temperature controller to control the heater. At the end of the deposition, when the deposition gas flow and/or the deposition power are removed, the heater current is again cut off. In this embodiment, the heater current again remains off for a reactant removal time interval 61 of 2 seconds. The duration of the current cutoff at the beginning of the deposition does not need to be the same as that of the current cutoff at the end of the deposition, however.

Figure 4:
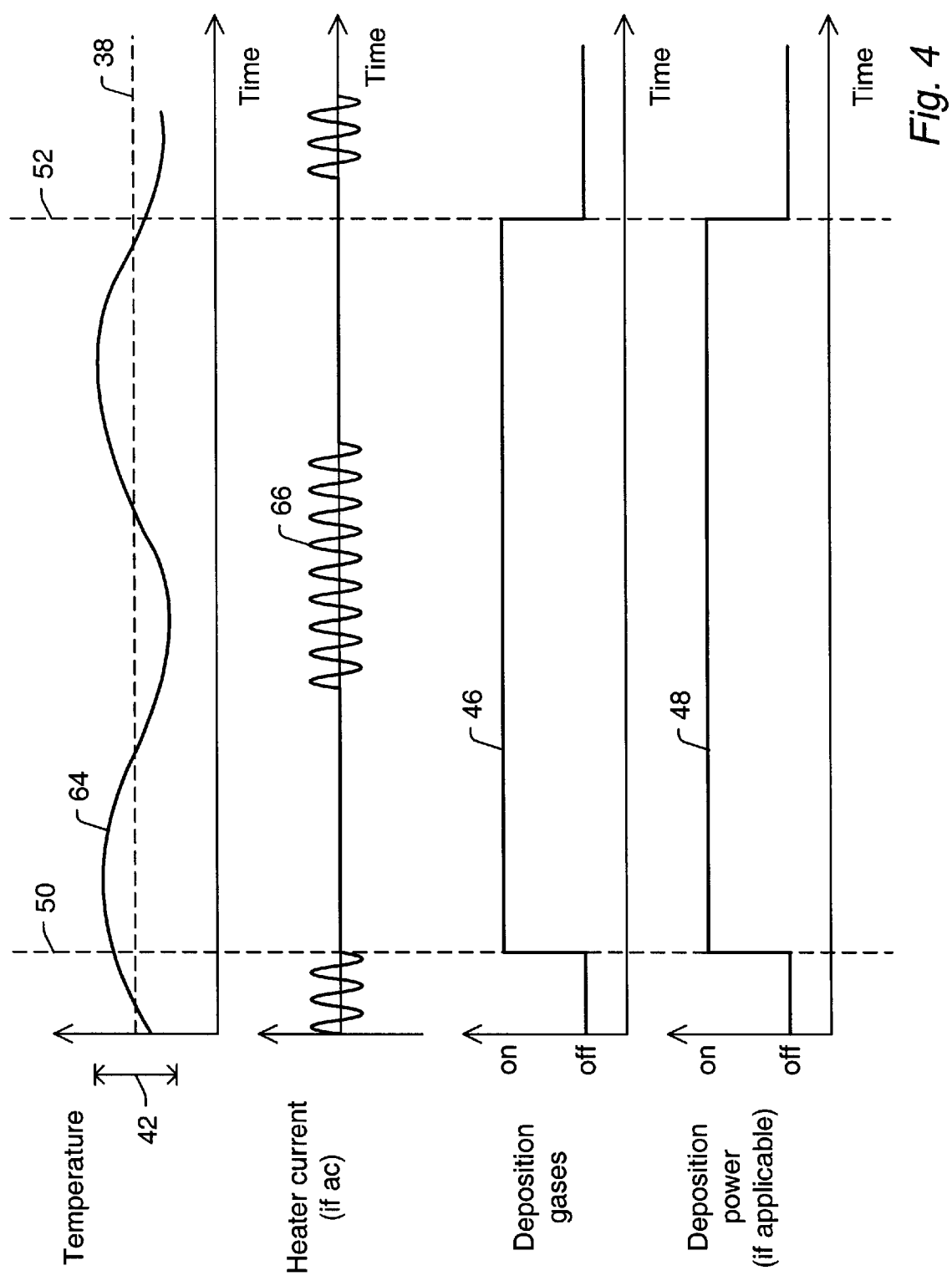
FIG. 4 is a graph showing representative temperature, heater current, gas flow, and deposition power signal waveforms during a deposition sequence corresponding to an alternative embodiment of the method.

A set of signals corresponding to an alternative embodiment of the method recited herein is shown in FIG. 4. In the embodiment of FIG. 4, the status of the heater current is monitored before starting the deposition. If the heater current is on, deposition start 50 is delayed until the heater current is off. In this way, the deposition may be started with heater current off, but the normal action of the temperature controller is not interfered with. When a deposition is started just after the heater current is turned off during the normal operation of a temperature controller, a longer "off" time is available before the heater is turned on again than is typically available if the heater is turned off at an arbitrary time. This is illustrated by comparison of heater current signals 66 of FIG. 4 and 58 of FIG. 3. This longer "off" time allow longer depositions during which the heater current remains off to be performed. If the deposition is started at a later time during the "off" cycle of the heater, however, the available time before the heater is turned on again will be shorter. A longer current-off time for a deposition may be achieved by monitoring the heater current before deposition long enough to observe at least a portion of a heater "on" cycle. In this way, the deposition can be started just after the end of this heater "on" cycle, ensuring a relatively long heater "off" time for the deposition. Although not shown in the embodiment of FIG. 4, the substrate heater could be turned off at the end of the deposition, as shown in FIG. 3.

Figure 5:
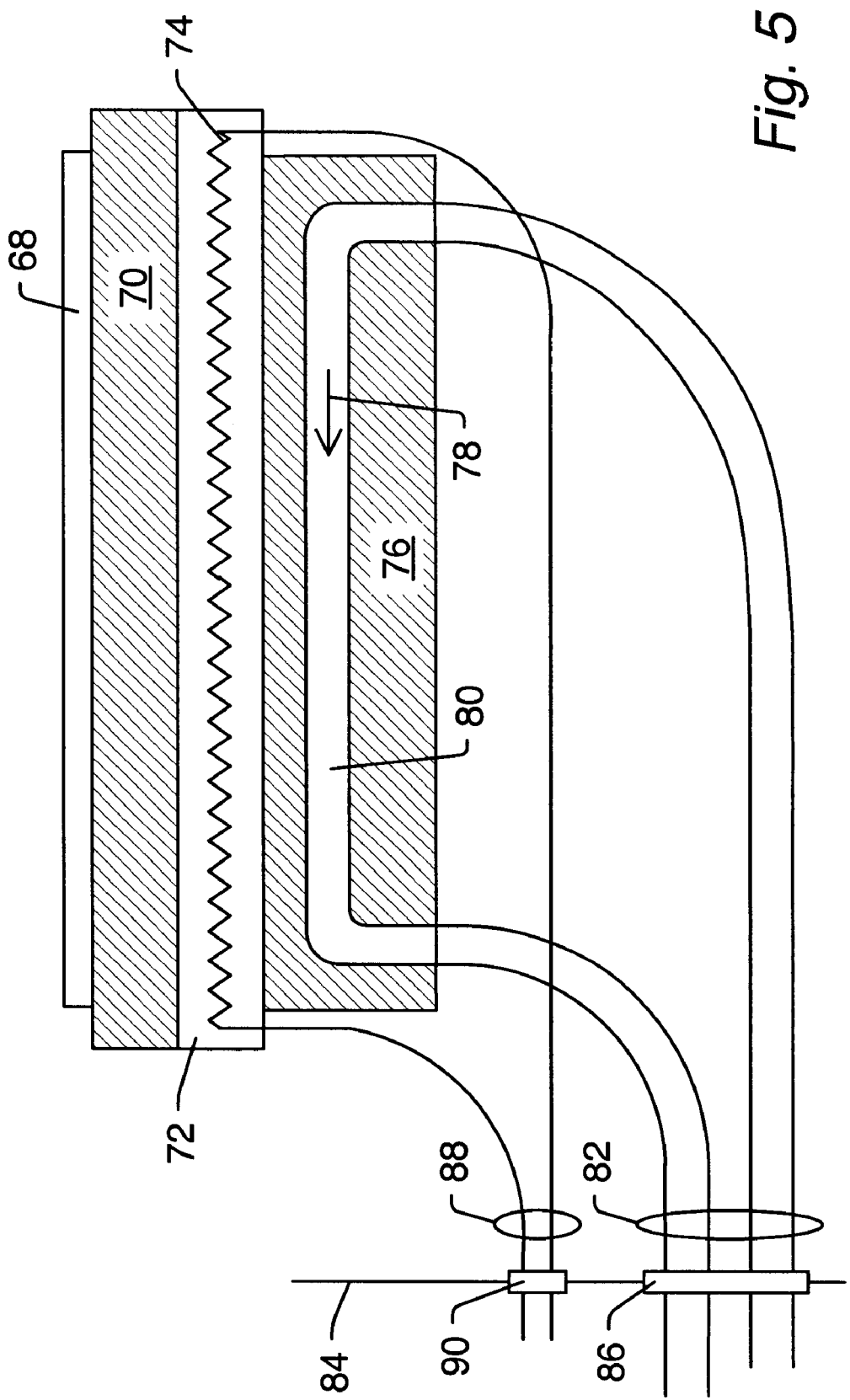
FIG. 5 is a cross-sectional view showing an exemplary substrate heater with a fluid-cooled heat sink.

In some deposition chambers, it is possible to reduce the thermal load on the substrate heater, thereby further increasing the time during which the heater is off when an on/off controller is used to maintain a given temperature. An example of a substrate heater having a thermal load which can be reduced is shown in FIG. 5. Substrate 68 is mounted upon substrate holder 70. Substrate heater 72, including heater filament 74, is used to heat substrate 68. Heat sink 76 is placed in the vicinity of substrate heater 72. Heat sink 76 includes one or more fluid channels 80 through which fluid 78, typically water or a water-based solution, may be directed in order to carry heat away from heat sink 76. Fluid lines 82 and heater lines 88 extend through chamber wall 84 using fluid feedthrough 86 and electrical feedthrough 90, respectively. This type of fluid-cooled heat sink may be used, for example, to increase the speed of cooling from elevated temperatures. Such substrate heater heat sinks are used, for example, in some sputtering machines manufactured by Applied Materials, Inc.

The presence of a fluid-cooled heat sink, such as heat sink 78 of FIG. 5, provides a choice of whether or not to direct a fluid through fluid channels, such as channels 80, of the heat sink during a deposition. In this way, the thermal "load", or resistance to being heated, seen by the heater can be changed. Turning off the cooling fluid in the heat sink of FIG. 5 allows a given temperature to be maintained with less heater "on" time than is needed if the cooling fluid is flowing. Exemplary temperature and heater current signals for the heater of FIG. 5 are shown in FIGS. 6a and 6b.

Specifically, temperature and heater current signals corresponding to operation with fluid flowing through the heat sink are shown in FIG. 6a, while signals corresponding to operation without fluid flowing are shown in FIG. 6b. Signal 92 represents the heater current supplied using an on/off temperature controller with the cooling fluid on, while signal 96 represents the heater current needed to keep actual temperature 98 within acceptable range 102 of the same setpoint temperature (100) when the cooling fluid is turned off. It can be seen by comparison of signals 92 and 96 that the times during which the heater current is off are longer when the cooling fluid is removed. In chambers for which the thermal load of the substrate heater can be changed, reduction of this thermal load, in combination with the techniques described above for beginning a deposition with the heater current off, can allow an increased current-free deposition time.

Figure 7:
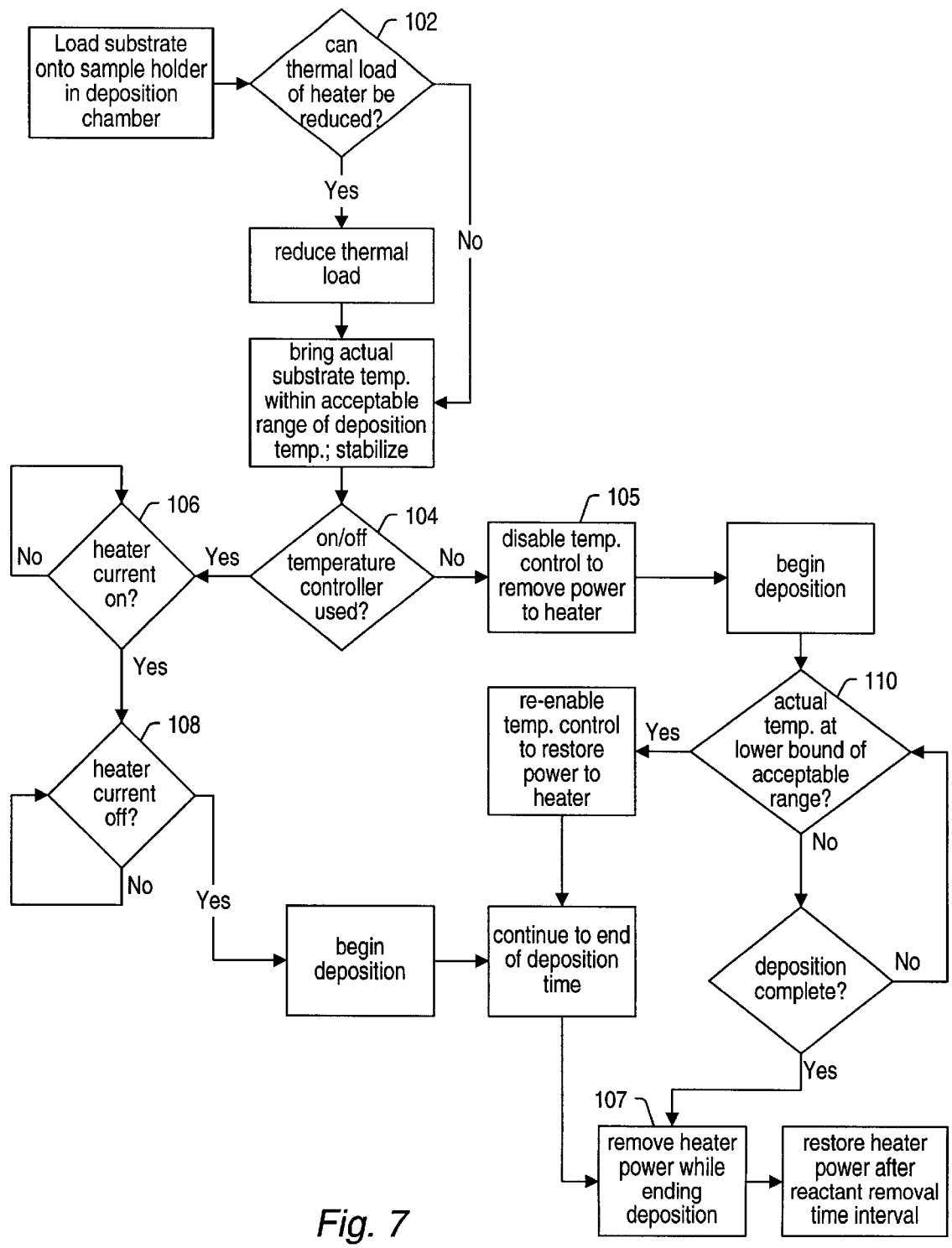
FIG. 7 is a flow diagram of a deposition process sequence for some embodiments of the method recited herein.

A procedure for performing a deposition which includes some embodiments of the method recited herein is given by the flow diagram of FIG. 7. A substrate upon which a material layer is to be deposited is loaded onto a substrate holder of a deposition chamber, such as chamber 10 of FIG. 1. The substrate is preferably a semiconductor topography, i.e. a semiconductor substrate at some stage of an integrated circuit fabrication process. If possible (see decision box 102 of FIG. 7), depending on the construction of the substrate holder and heater, the thermal load of the heater is reduced before bringing the substrate to within the acceptable range of the deposition temperature setpoint. This reduction of thermal load is done in cases for which, for example, rapid cooling from an elevated temperature is not required. For many of the depositions performed during semiconductor fabrication processes, a single substrate temperature is used for the duration of the deposition, and the rapid cooling facilitated by a fluid-cooled heat sink may therefore not be necessary.

If an on/off temperature controller is used ("yes" branch of decision box 104), an embodiment of the method similar to that discussed in the description of FIG. 4 may be implemented. The heater current is monitored, possibly by monitoring a controller signal, to determine whether the heater current is on. As noted in the discussion of FIG. 4, the longest deposition with the heater off is believed to be achieved by beginning a deposition just after the heater is turned off by the controller. It is therefore desirable to monitor the heater current long enough to observe at least a portion of an "on" cycle, so that the deposition can be started just after this "on" cycle ends. Therefore, if the heater current is initially not on ("no" branch of decision box 106), the current is monitored until it is on. At that time, the current is monitored (decision box 108) until it is again turned off by the controller. Monitoring of the current typically involves repeatedly checking its status, preferably at intervals of about one second or less. The deposition is then started just after the heater current is turned off. A short delay (preferably on the order of few seconds or less) in beginning the deposition may be introduced as an option to allow conditions to stabilize (for example, to allow species outgassed when the heater current was on to be pumped away). The deposition is continued for the desired deposition time. Depending on the length of the deposition, the heater current may be turned on again during the course of the deposition, so that the substrate temperature is kept within the acceptable range of the setpoint temperature. In the embodiment of FIG. 7, the substrate heater is turned off at the end of the deposition (box 107) to allow a heater-current-free time interval for removal of reactant species.

If, on the other hand, a temperature controller is used which does not turn the heater current completely off to control it ("no" branch of decision box 104), the control of the heater current by the temperature controller is disabled so that the heater current is turned off (box 105). This may be done in various ways such as by an instruction to the controller, by removing the physical connection between the controller and the heater, or, in some controllers, by putting the controller in a manual rather than an automatic mode. The deposition is then started. Because the substrate temperature is not controlled by the temperature controller during this stage of the deposition, the actual temperature must be monitored to make sure it stays within the acceptable range. This monitoring may be done manually or by a computer. If the actual temperature approaches the lower end of the acceptable range before the deposition is complete ("yes" branch of decision box 110), control of the temperature by the temperature controller is re-established. This embodiment of the method is similar to that corresponding to the signals shown in FIG. 3. As noted above, the embodiment of FIG. 7 includes a cutoff of the substrate heater power at the end of the deposition (box 107). The deposition is ended by removing the reactant gas flow and/or removing plasma power, depending on the nature of the deposition process. At approximately the same time, power to the substrate heater is cut. The power to the heater may be cut in ways similar to those described for the heater power removal of box 105. The substrate heater power is kept off for a reactant removal time, such as time 61 in FIG. 3.

Figure 8:
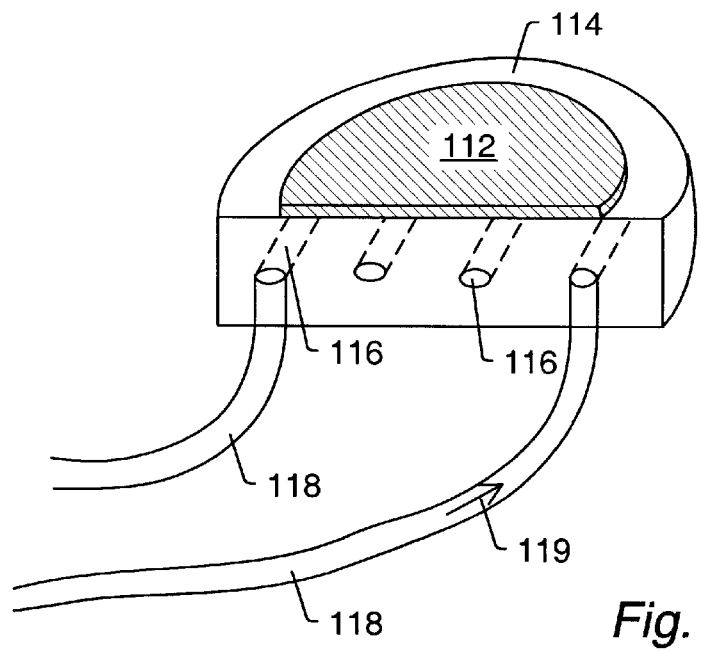
FIG. 8 is a cross-sectional perspective view of an exemplary fluid-flow substrate heater.

An alternative way to avoid the presence of heater filament currents during a deposition is to use a heater which does not employ filament currents. An example of such a heater design is shown in FIG. 8. In the cross-sectional perspective view of FIG. 8, substrate 112 is mounted on the upper surface of substrate mounting block 114. Substrate mounting block 114 is preferably made of a thermally conductive material. In a deposition system which employs a plasma, such as a PECVD or sputtering system, mounting block 114 may be made from metal to facilitate connection of the substrate holder to ground potential (or possibly other potentials). One or more fluid channels 116 are formed within mounting block 114. Dashed lines are used to indicate the extension of channels 116 into mounting block 114. In the embodiment of FIG. 8, a serpentine fluid channel is used, such that central portions of channel 116 are cut by the cross-section of FIG. 8. Fluid channels 116 connect to fluid lines 118 which circulate heated fluid 119 through mounting block 114, thereby heating substrate 112. No electrical substrate heater filaments are used, so that no magnetic fields are generated. This lack of magnetic fields may improve the adhesion and uniformity of atoms being deposited, as described above.

Figure 9:
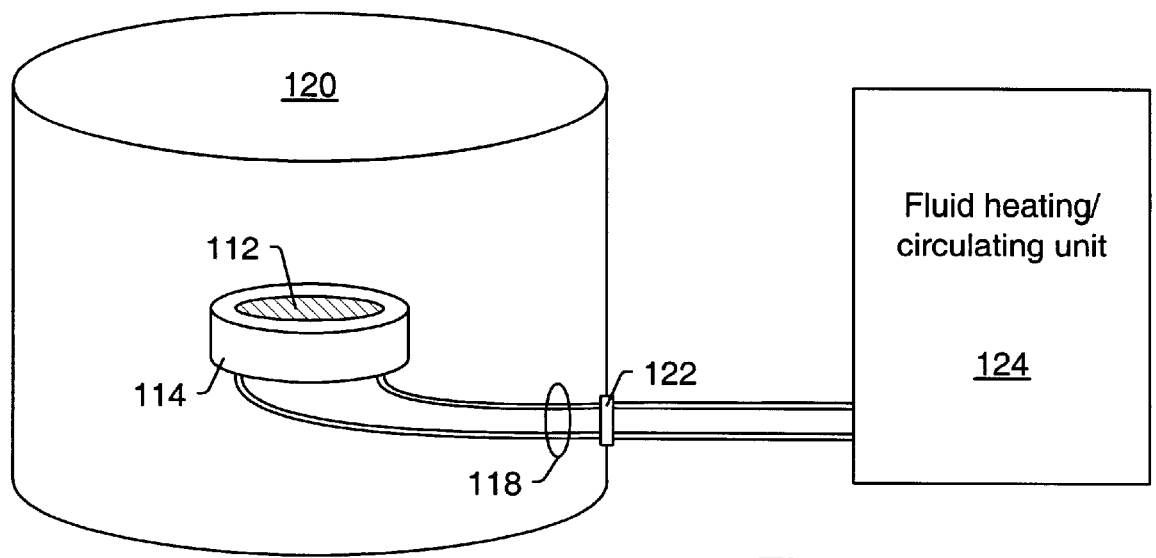
FIG. 9 is a side elevation view of a deposition chamber, including the substrate heater of FIG. 8 and a fluid heating and circulating unit.

A side elevation view of an exemplary fluid-flow substrate heating system in a deposition chamber is shown in FIG. 9. Substrate 112, substrate mounting block 114, and fluid lines 118 are arranged within deposition chamber 120. Fluid lines 118 extend through fluid feedthrough 122 in the wall of chamber 120 to fluid heating/circulating unit 124. Heating/circulating unit 124 contains one or more heaters to heat fluid 119 and one or more pumps to circulate it through substrate mounting block 114, and may contain a controller to maintain a stable temperature of fluid 119. The composition of fluid 119 must be chosen carefully, since the fluid should preferably both withstand elevated temperatures and remain liquid at room temperature. Examples of suitable choices may include some oils and organic heat transfer fluids, such as the XCELTHERM® series of fluids manufactured by Radco Industries. Such fluids may allow operation of a fluid flow heater over a range from about 0° C. to about 350° C. Suitable heater/circulator units may include portable hot oil units manufactured by Budzar Industries.

It will be appreciated to those skilled in the art having the benefit of this disclosure that this invention is believed to provide a method and an apparatus for forming high-quality deposited material layers. Further modifications and alternative embodiments of various aspects of the invention will be apparent to those skilled in the art in view of this description. For example, the method recited herein may be performed without a temperature controller in some embodiments, either by manual control of the deposition parameters or by using a computer in the role of a temperature controller. Furthermore, deposition chambers differing from the exemplary chambers shown above may be used. For example, deposition chambers containing multiple substrate mounting stations may be used. It is intended that the following claims be interpreted to embrace all such modifications and changes and, accordingly, the specification and drawings are to be regarded in an illustrative rather than a restrictive sense.

What is claimed is:

1. A computer-compatible carrier medium comprising program instructions executable on a computational device for:

initiating heating of a s substrate to a deposition temperature by flowing a current through one or more heater filaments in a deposition chamber;

discontinuing the current flow to the heater filament; and initiating deposition of a material layer subsequent to said discontinuing the current flow.

2. The medium as recited in claim 1, further comprising program instructions for:

monitoring the temperature of the substrate prior to and during deposition of the material layer; and restoring current flow to the heater filaments if the monitored temperature reaches a lower boundary of an acceptable deposition temperature range.

3. The medium as recited in claim 1, further comprising program instructions for:

ending deposition of the material layer after a predetermined deposition time;

again discontinuing current flow to the heater filaments, at approximately the same time as said ending the deposition; and restoring current flow to the heater filaments, at the end of a reactant removal time interval.

4. The medium as recited in claim 1, further comprising program instructions for reducing a thermal load associated with a substrate heater in the deposition chamber, wherein the substrate heater comprises the one or more heater filaments, prior to said initiating deposition of the material layer.

5. The medium as recited in claim 1, wherein said initiating deposition of the material layer comprises initiating a sputter deposition.

6. The medium as recited in claim 1, wherein said initiating deposition of the material layer comprises initiating a chemical vapor deposition.

7. A system for deposition of a material layer over a substrate in a deposition chamber, comprising a temperature controller configured to supply a current to one or more heater filaments used to heat a substrate within the deposition chamber, wherein the temperature controller is operated to discontinue current to the heater filaments during an initial portion of a deposition sequence.

8. The system as recited in claim 7, wherein the temperature controller is further operated to discontinue current to the heater filaments at the end of the deposition sequence for a reactant removal time interval and to restore current to the heater filaments at the end of the reactant removal time interval.

9. The system as recited in claim 7, wherein the temperature controller is further configured to monitor the temperature of the substrate prior to and during the deposition sequence of the material layer and further operated to restore current flow to the heater filaments if the monitored temperature reaches a lower boundary of an acceptable deposition temperature range.

10. The system as recited in claim 7, further comprising a computer system coupled to the temperature controller and operated to control the deposition sequence.

* * * * *

UNITED STATES PATENT AND TRADEMARK OFFICE
CERTIFICATE OF CORRECTION

PATENT NO. : 6,270,580 B1
DATED : August 7, 2001
INVENTOR(S) : Vu et al.

It is certified that error appears in the above-identified patent and that said Letters Patent is hereby corrected as shown below:

<u>Title page,</u>
Item [54], please delete the word "DETECT" and substitute therefor
-- DEFECT --.

Signed and Sealed this

Fourteenth Day of May, 2002

*Attest:*

*Attesting Officer*

JAMES E. ROGAN
*Director of the United States Patent and Trademark Office*